United States Patent
Isobe

(10) Patent No.: US 9,111,891 B2
(45) Date of Patent: Aug. 18, 2015

(54) EL DISPLAY APPARATUS AND MANUFACTURING METHOD THEREOF

(71) Applicant: JOLED INC., Tokyo (JP)

(72) Inventor: Takashi Isobe, Nara (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/375,008

(22) PCT Filed: Jan. 30, 2013

(86) PCT No.: PCT/JP2013/000473
§ 371 (c)(1),
(2) Date: Jul. 28, 2014

(87) PCT Pub. No.: WO2013/118462
PCT Pub. Date: Aug. 15, 2013

(65) Prior Publication Data
US 2015/0008414 A1 Jan. 8, 2015

(30) Foreign Application Priority Data
Feb. 6, 2012 (JP) .................................. 2012-023069

(51) Int. Cl.
*H01L 27/32* (2006.01)
*H01L 51/50* (2006.01)
(Continued)

(52) U.S. Cl.
CPC ........ *H01L 27/3276* (2013.01); *H01L 51/5076* (2013.01); *H01L 51/5088* (2013.01); *H01L 51/5221* (2013.01); *H01L 51/5228* (2013.01); *H01L 51/5243* (2013.01);
(Continued)

(58) Field of Classification Search
CPC . H01L 27/3276; H01L 51/56; H01L 51/5221; H01L 51/5076; H01L 51/5243; H01L 51/5088; H01L 2227/323
See application file for complete search history.

(56) References Cited

U.S. PATENT DOCUMENTS 5,443,922 A 8/1995 Nishizaki et al.
7,291,973 B2 * 11/2007 Ishihara et al. ............... 313/505
(Continued)

FOREIGN PATENT DOCUMENTS

JP 05-163488 6/1993
JP 06-231881 8/1994
(Continued)

OTHER PUBLICATIONS

Search report from PCT/JP2013/000473, mail date is Apr. 23, 2013.

*Primary Examiner* — Ida M Soward
(74) *Attorney, Agent, or Firm* — Greenblum & Bernstein, P.L.C.

(57) ABSTRACT

EL display device with long lifetime for electrons being injected into a light-emission layer at a high rate, and method of manufacturing the EL display device are provided. The EL display device includes: base; pixel electrode on the base; auxiliary wiring on the base, the auxiliary wiring not overlapping with the pixel electrode; light-emission layer above the pixel electrode; charge transport layer above the auxiliary wiring and the pixel electrode, the charge transport layer continuously extending over the auxiliary wiring and the pixel electrode; and common electrode on the charge transport layer, the common electrode continuously extending over the auxiliary wiring and connected with the auxiliary wiring. The common electrode includes at least one metal selected from a group consisting of alkali metals and alkaline-earth metals.

11 Claims, 11 Drawing Sheets

(51) Int. Cl.
  *H01L 51/52* (2006.01)
  *H01L 51/56* (2006.01)
  *H05B 33/26* (2006.01)

(52) U.S. Cl.
  CPC .......... *H01L 51/56* (2013.01); *H01L 2227/323* (2013.01); *H05B 33/26* (2013.01)

(56) References Cited

U.S. PATENT DOCUMENTS

| | | | |
|---|---|---|---|
| 7,579,774 B2 * | 8/2009 | Yamazaki et al. | 313/505 |
| 7,709,843 B2 * | 5/2010 | Yamazaki et al. | 257/72 |
| 7,833,845 B2 * | 11/2010 | Yamazaki et al. | 438/149 |
| 8,040,056 B2 * | 10/2011 | Abe et al. | 313/506 |
| 8,222,808 B2 * | 7/2012 | Kitazume et al. | 313/504 |
| 8,492,764 B2 * | 7/2013 | Yamazaki et al. | 257/59 |
| 2001/0004113 A1 | 6/2001 | Motomatsu | |
| 2002/0158835 A1 | 10/2002 | Kobayashi et al. | |
| 2005/0012454 A1 | 1/2005 | Yamazaki et al. | |
| 2007/0205718 A1 | 9/2007 | Yamazaki et al. | |
| 2009/0286445 A1 | 11/2009 | Yamazaki et al. | |
| 2010/0096622 A1 | 4/2010 | Iizumi et al. | |
| 2010/0302221 A1 | 12/2010 | Okumoto | |
| 2012/0074397 A1 | 3/2012 | Okumoto | |
| 2012/0280218 A1 | 11/2012 | Watanabe et al. | |
| 2014/0159074 A1 | 6/2014 | Isobe | |

FOREIGN PATENT DOCUMENTS

| | | |
|---|---|---|
| JP | 2001-176655 | 6/2001 |
| JP | 2002-318556 | 10/2002 |
| JP | 2010-033936 | 2/2010 |
| JP | 2010-123512 | 6/2010 |
| JP | 2010-129346 | 6/2010 |
| JP | 2011-029208 | 2/2011 |
| JP | 2011-040167 | 2/2011 |
| JP | 2011-166102 | 8/2011 |
| WO | 2008/102644 | 8/2008 |
| WO | 2010/070798 | 6/2010 |
| WO | 2012/001728 | 1/2012 |

* cited by examiner

Light-
emission    Ba
layer

Light-
emission    ETL    Ba
layer

Light-        ITO
emission
layer

Light-    ETL    ITO
emission
layer

EL DISPLAY APPARATUS AND MANUFACTURING METHOD THEREOF

TECHNICAL FIELD

The present disclosure relates to electroluminescent (EL) display devices and a method of manufacturing EL display devices. More specifically, the present disclosure relates to a technology for yielding EL display devices having long lifetime.

DESCRIPTION OF THE RELATED ART

One example of an EL display device is an organic EL display device, which makes use of electroluminescence of organic material. For example, a top-emission type organic EL display device includes a base, a pixel electrode disposed on the base, and other layers, such as a hole injection layer, a hole transport layer, an organic light-emission layer, an electron transport layer, and a common electrode, disposed in the stated order above the pixel electrode. In such an organic EL display device, particularly when the organic EL display device has a large-size screen, the voltage applied to the common electrode may be low at a certain area. There exists conventional technology that attempts to prevent this problem by disposing auxiliary wiring at an area on the base where the pixel electrode is not disposed and electrically connecting the auxiliary wiring with the common electrode (Patent Literature 1).

The following provides an example of how the above-described layers of the organic EL display device are formed. The pixel electrode and the auxiliary wiring are made of an alloy of Al, Ag, or the like, and are formed through sputtering. The hole injection layer is made of an oxide of a transition metal, and is formed through sputtering. The hole transport layer and the organic light-emission layer are made of a polymeric material, and are formed through printing. The electron transport layer is made of an organic material doped with an alkali metal, and is formed through vapor deposition. The common electrode is made of an oxide of a light-transmissive metal such as ITO (indium tin oxide), and is formed through either vapor deposition or sputtering.

Among such layers, patterning is performed in the forming of the pixel electrode because a separate pixel electrode is formed for each pixel of the organic EL display device. In addition, patterning is performed in the forming of each of the hole transport layer and the organic light-emission layer, which are formed through printing as described above. Meanwhile, patterning is not performed in the forming of the hole injection layer, the electron transport layer, and the common electrode, and each of such layers is disposed as a film that continuously extends within one pixel and between pixels of the organic EL display device (referred to as a "continuous film" in the following). This is because such layers do not need to be formed separately for each pixel, and also because patterning is not well-suited for film-forming methods such as vapor deposition and sputtering. Forming the hole injection layer, the electron transport layer, and the common electrode as continuous films simplifies the manufacturing process of the organic EL display device.

CITATION LIST

Patent Literature

[Patent Literature 1]
Japanese Patent Application Publication No. 2002-318556

SUMMARY

Technical Problem

FIG. 11A illustrates a case where, in an organic EL display device having a structure similar to that described above, (i) the common electrode is made of ITO and (ii) the electron transport layer does not exist between the common electrode and the organic light-emission layer. In such a case, the electron injection barrier between the common electrode and the organic light-emission layer is too high for electrons to be easily injected from the common electrode into the organic light-emission layer. FIG. 11B illustrates a case where the electron transport layer (illustrated as ETL in FIG. 11B) exists between the organic light-emission layer and the common electrode, which is made of ITO. As illustrated in FIG. 11B, the electron transport layer raises electrons to a higher energy level and allows electrons to be injected from the common electrode into the organic light-emission layer.

Thus, when existing between the common electrode and the organic light-emission layer, the electron transport layer moderates the energy level gap in the movement of electrons. However, when the electron transport layer is disposed, electrons are injected into the organic light-emission layer via charge transfer complexes (referred to as "CT complexes" in the following) in the electron transport layer, and the electron transport layer becomes a bottleneck in the movement of electrons. Accordingly, a small amount of electrons is injected into the organic light-emission layer, which results in the organic EL display device having short lifetime.

In view of the above-described problem, the present disclosure provides an EL display device having long lifetime due to much charge being injected into a light-emission layer.

Solution to Problem

The present disclosure provides an EL display device including a base; a pixel electrode disposed on the base; auxiliary wiring disposed on the base, the auxiliary wiring not overlapping with the pixel electrode; a light-emission layer disposed above the pixel electrode; a charge transport layer disposed above the auxiliary wiring and the pixel electrode, the charge transport layer continuously extending over the auxiliary wiring and the pixel electrode; and a common electrode disposed on the charge transport layer, the common electrode electrically connected to the auxiliary wiring and continuously extending over the auxiliary wiring and the pixel electrode. In the EL display device, the common electrode includes at least one metal selected from a group consisting of alkali metals and alkaline-earth metals.

The present disclosure provides a method of manufacturing an EL display device, the method including forming a pixel electrode on a base; forming auxiliary wiring on the base, the auxiliary wiring not overlapping with the pixel electrode; forming a light-emission layer above the pixel electrode; forming a charge transport layer above the auxiliary wiring and the pixel electrode, the charge transport layer continuously extending over the auxiliary wiring and the pixel electrode; and forming a common electrode on the charge transport layer, the common electrode including at least one metal selected from a group consisting of alkali metals and alkaline-earth metals, continuously extending over the auxiliary wiring and the pixel electrode, and being electrically connected to the auxiliary wiring.

Advantageous Effects

In the EL display device pertaining to the present disclosure, the common electrode includes at least one metal selected from the group consisting of alkali metals and alkaline-earth metals. Due to this, much charge is injected into the light-emission layer. This results in a balance between the amount of electrons and the amount of holes in the light-emission layer (referred to as a "carrier balance" in the following) being desirable. Accordingly, the risk of the material of the light-emission layer undergoing degradation is low, and thus, the EL display device has long lifetime. In addition, the common electrode, due to being disposed on the charge transport layer, does not oxidize despite being in contact with a layer disposed therebelow (i.e., the charge transport layer). Due to this, oxidation of the common electrode and the consequent electric disconnection between the auxiliary wiring and the common electrode do not occur, despite the common electrode including at least one metal selected from the group consisting of alkali metals and alkaline-earth metals.

Meanwhile, the method pertaining to the present disclosure includes procedures for forming the common electrode and the charge transport layer described above. As such, in an EL display device manufactured according to the method, the risk is low of light-emission layer material undergoing degradation. Thus, the method yields an EL display device having long lifetime.

DESCRIPTION OF EMBODIMENT

Figure 1:
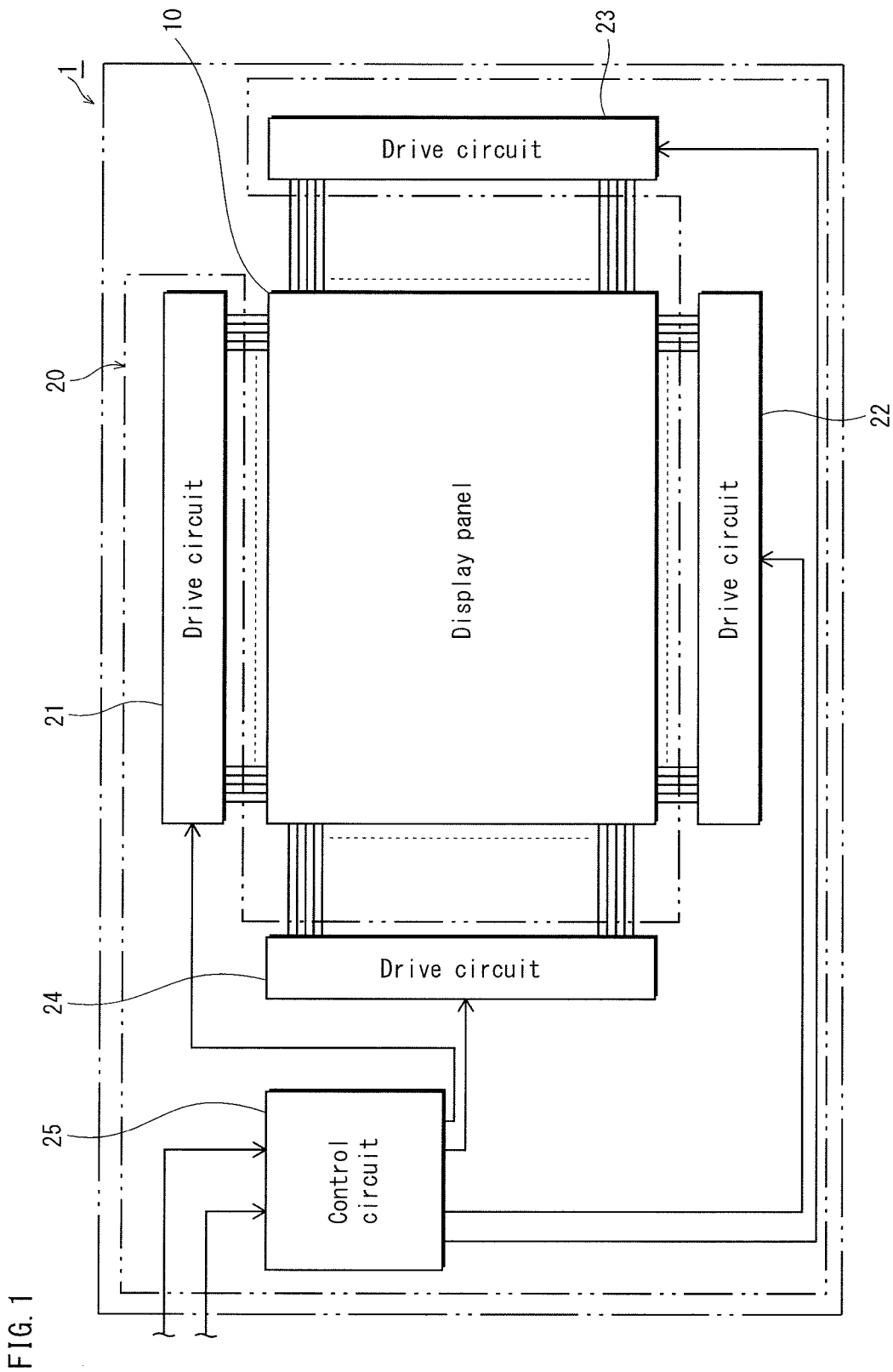
FIG. 1 illustrates the overall structure of an EL display device pertaining to the present disclosure.

The following describes an EL display device pertaining to the present disclosure and a method pertaining to the present disclosure of manufacturing an EL display device. Reference is made to the accompanying drawings where necessary.

Summary of Aspects

The present disclosure provides an EL display device including: a base; a pixel electrode disposed on the base; auxiliary wiring disposed on the base, the auxiliary wiring not overlapping with the pixel electrode; a light-emission layer disposed above the pixel electrode; a charge transport layer disposed above the auxiliary wiring and the pixel electrode, the charge transport layer continuously extending over the auxiliary wiring and the pixel electrode; and a common electrode disposed on the charge transport layer, the common electrode electrically connected to the auxiliary wiring and continuously extending over the auxiliary wiring and the pixel electrode. In the EL display device, the common electrode includes at least one metal selected from a group consisting of alkali metals and alkaline-earth metals.

The EL display device may further comprise: an oxide layer disposed above the pixel electrode and the auxiliary wiring, the oxide layer including an oxide of a transition metal and continuously extending over the auxiliary wiring and the pixel electrode, and in the EL display device, the charge transport layer may be disposed on the oxide layer and may include an organic material doped with at least one metal selected from the group consisting of alkali metals and alkaline earth metals.

In the EL display device, the common electrode may include barium. In the EL display device, the charge transport layer may include at least 5 wt % barium and at most 18 wt % barium.

In the EL display device, the light-emission layer may have a thickness of at least 60 nm and less than 100 nm. In the EL display device, current density per unit area of the light-emission layer may be at least 1.5 mA/cm$^2$ and at most 2.5 mA/cm$^2$.

The EL display device may further comprise: an oxidation prevention layer disposed on the common electrode, the oxidation prevention layer including the same organic material as the charge transport layer.

The EL display device may further comprise: a sealing film disposed on the oxidation prevention layer, the sealing film including an oxide of said at least one metal.

In the EL display device, the pixel electrode may be an anode, the common electrode may be a cathode, and the charge transport layer may be an electron transport layer.

In the EL display device, the oxide layer may be a hole injection layer including one of tungsten oxide and molybdenum oxide.

The present disclosure provides a method of manufacturing an EL display device, the method including forming a pixel electrode on a base; forming auxiliary wiring on the base, the auxiliary wiring not overlapping with the pixel electrode; forming a light-emission layer above the pixel electrode; forming a charge transport layer above the auxiliary wiring and the pixel electrode, the charge transport layer continuously extending over the auxiliary wiring and the pixel electrode; and forming a common electrode on the charge transport layer, the common electrode including at least one metal selected from a group consisting of alkali metals and alkaline-earth metals, continuously extending over the auxiliary wiring and the pixel electrode, and being electrically connected to the auxiliary wiring.

EL Display Device

FIG. 1 illustrates the overall structure of an EL display device pertaining to the present disclosure. As illustrated in FIG. 1, an EL display device 1 pertaining to the present embodiment is an organic EL display device including a display panel 10 and a drive control unit 20 connected to the display panel 10. Although description is provided above that the EL display device 1 is an organic EL display device, the EL display device 1 is not necessarily an organic EL display device, and may be an inorganic EL display device or an EL display device of any other type.

The drive control unit 20 includes a control circuit 25 and four drive circuits, namely drive circuits 21 through 24. When the EL display device 1 is actually implemented, the drive control unit 20 does not necessarily have to be arranged and connected with respect to the display panel 10 as illustrated in FIG. 1.

Figure 2:
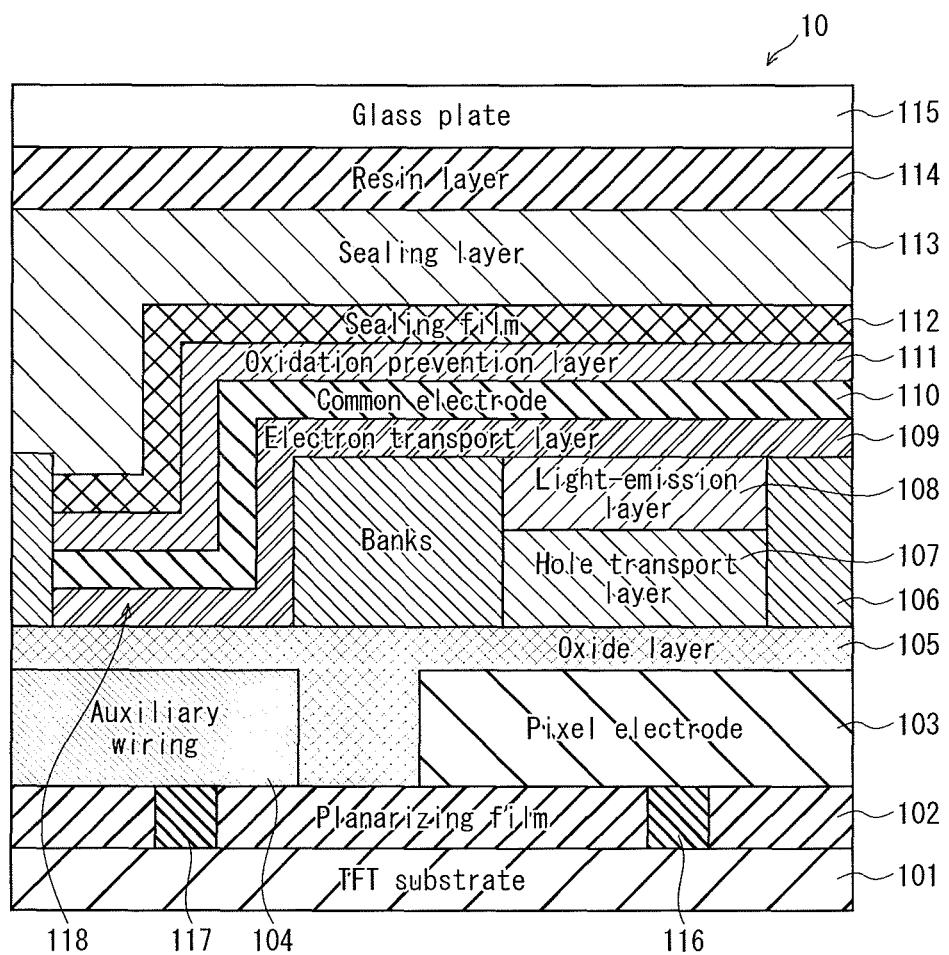
FIG. 2 is a schematic cross-sectional diagram of a display panel pertaining to the present disclosure.

FIG. 2 is a schematic cross-sectional diagram illustrating a display panel pertaining to the present disclosure. As illustrated in FIG. 2, a display panel 10 pertaining to the present embodiment is a top-emission type organic EL display panel, and includes pixels of the light-emission color red (R), pixels of the light-emission color green (G), and pixels of the light-emission color blue (B). The pixels in the display panel 10 are arranged to form lines or to form a matrix. As illustrated in FIG. 2, each pixel of the display panel 10 includes a TFT substrate 101, and the following layers disposed on or above the TFT substrate 101: a planarizing film 102; a pixel electrode 103; auxiliary wiring 104; an oxide layer 105; banks 106; a hole transport layer 107; a light-emission layer 108; an electron transport layer 109; a common electrode 110; an oxidation prevention layer 111; a sealing film 112; a sealing layer 113; a resin layer 114; and a glass plate 115.

The TFT substrate 101 is, for example, a thin-film transistor array substrate including a base substrate and a drive circuit disposed on the base substrate. The base material is made, for example, of an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

The planarizing film 102 is disposed on the TFT substrate 101 and planarizes unevenness of the surface of the TFT substrate 101. The planarizing film 102 is made, for example, of an organic material such as an acrylic resin, a polyimide resin, or a novolac type phenolic resin, or an inorganic material such as silicon oxide ($SiO2$) or silicon nitride ($Si_3N_4$).

The pixel electrode 103 is a reflecting anode that is provided to each pixel of the display panel 10. The multiple pixel electrodes 103 disposed above a base (more specifically, on the planarizing film 102) form a matrix or one or more arrays. The pixel electrode 103 is composed of a metal film made of ACL, and a transparent conductive film made of indium zinc oxide (IZO) disposed on the metal film. The pixel electrode 103 may have a different structure. For example, the pixel electrode 103 may be composed of a single film made of: a metal alloy such as ACL, APC (an alloy of silver, palladium, and copper), ARA (an alloy of silver, rubidium, and gold), MoCr (an alloy of molybdenum and chromium), or NiCr (an alloy of nickel and chromium); a transparent conductive material such as IZO or ITO; or a metal such as aluminum or silver. Alternatively, the pixel electrode 103 may be composed of multiple films each made of one of the metal alloys described above, one of the transparent conductive materials described above, or one of the metals described above.

The auxiliary wiring 104 is disposed at a region of the base that does not overlap with a region of the base above which the pixel electrode 103 is disposed. The auxiliary wiring 104 is electrically connected with the common electrode 100. Specifically, the auxiliary wiring 104 has a shape of a line that extends parallel with an array of pixel electrodes 103. Thus, in the display panel 10, a plurality of lines of the auxiliary wiring 104 are disposed, one line for one pixel array. The auxiliary wiring 104 is composed of a metal film made of ACL, and a transparent conductive film made of IZO disposed on the metal film. The auxiliary wiring 104 may have a different structure. For example, the auxiliary wiring 104 may be composed of a single film made of: a metal alloy such as ACL, APC, ARA, MoCr, or NiCr; a transparent conductive material such as IZO or ITO; or a metal such as aluminum or silver. Alternatively, the auxiliary wiring 104 may be composed of multiple films each made of one of the metal alloys described above, one of the transparent conductive materials described above, or one of the metals described above.

The pixel electrode 103 and the auxiliary wiring 104 are electrically connected to the TFT substrate 101 via a contact hole 116 and a contact hole 117, respectively.

The oxide layer 105 is made, for example, of an oxide of a transition metal, and is disposed at least above the pixel electrode 103. The oxide layer 105 serves as a hole injection layer. In the present disclosure, the term "transition metal" may refer to any element in the range of elements in the periodic table from group 3 to group 11. Among various transition metals, tungsten, molybdenum, nickel, titanium, vanadium, chromium, manganese, iron, cobalt, niobium, hafnium, tantalum are preferable as the material of the oxide layer 105. This is since such transition metals, after oxidation, have excellent hole injection characteristics. Tungsten and molybdenum are particularly preferable as the material of the oxide layer 105. This is since, when sputtering is performed in an oxygen-present environment, an oxide layer 105 having oxygen deficiencies is readily formed. An oxide layer 105 having oxygen deficiencies has excellent hole injection characteristics.

The oxide layer 105 is a continuous film that continuously extends over the pixel electrode 103 and the auxiliary wiring 104. Forming the oxide layer 105 as a continuous film simplifies the manufacturing process of the display device 10.

Note that forming the oxide layer 105 as a continuous film results in the oxide layer 105 having a portion that is located above the auxiliary wiring 104 and below the common electrode 110. When the oxide layer 105 has such a portion, the common electrode 110 may undergo oxidation by coming in contact with the portion, and a metal oxide film may be formed as a result. When such a metal oxide film is formed, electrical disconnection between the auxiliary wiring 104 and the common electrode 110 may occur. In view of this problem, in the present embodiment, the electron transport layer 109 exists between the oxide layer 105 and the common electrode 110. Due to this, the common electrode 110 does not come in contact with the oxide layer 105, and the electrical connection between the auxiliary wiring 104 and the common electrode 100 is maintained.

Nevertheless, the oxide layer 105 need not be included in the EL display device pertaining to the present disclosure. Further, the oxide layer 105 may be made of an oxide other than an oxide of a transition metal, and may be made, for example, of an oxide of a transition metal alloy. Even when the oxide layer 105 is made of a material other than an oxide of a transition material, the oxide layer 110 may oxidize the common electrode 110 and electrical disconnection between the auxiliary wiring 104 and the common electrode 110 may occur without the electron transport layer 109 being disposed.

The banks 106 are made, for example, of an organic material such as an acrylic resin, a polyimide resin, or a novolac type phenolic resin, or an inorganic material such as $SiO_2$ or $Si_3N_4$. The banks 106 define a pixel region. Within one pixel region (i.e., a region defined by the banks), the hole transport layer 107 and the light-emission layer 108 are disposed in the stated order. Further, above the pixel region, the electron transport layer 109, the common electrode 110, the oxidation prevention layer 111, the sealing film 112, and the sealing layer 113 are disposed in the stated order. Note that each of such layers is a continuous film, i.e., continuously extends over pixel regions.

The hole transport layer 107 is disposed on the oxide layer 105 within the pixel region. The hole transport layer 107 serves as a hole transport layer, which transports holes injected thereto from the pixel electrode 103 into the light-emission layer 108. The hole transport layer 107 is made, for example, of a material such as PEDOT-PSS (poly(3,4-ethylenedioxythiophene) doped with polystyrene sulfonic acid) or derivatives (e.g. copolymers) of PEDOT-PSS.

The light-emission layer 108 is disposed above the oxide layer 105 (more specifically, on the hole transport layer 107) within the pixel region. The light-emission layer 108 serves as an organic light-emission layer, which emits light by making use of electroluminescence. The light-emission layer 108 is made of an organic material. One example of the organic material is F8BT(poly(9,9-di-n-octylfluorene-alt-benzothiadiazole)), which is an organic polymer. Alternatively, the light-emission layer 108 may be made of any known organic material. Examples of known organic material usable for forming the light-emission layer 108 include fluorescent materials such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as disclosed in Japanese Patent Application Publication No. 5-163488.

The electron transport layer 109 is one example of a charge transport layer pertaining to the present disclosure, and serves as an electron transport layer, which transports electrons injected thereto from the common electrode 100 into the light-emission layer 108. The electron transport layer 109 is a continuous film that is disposed on the oxide layer 105 above the auxiliary wiring 104 and on the light-emission layer 108 above the pixel electrode 103. Forming the electron transport layer 9 as a continuous film simplifies the manufacturing process of the display device 10. Further, due to the electron transport layer 109 being disposed on the oxide layer 105, i.e., due to the electron transport layer 109 existing between the oxide layer 105 and the common electrode 110, the common electrode 110 is not oxidized by the oxide layer 105.

The electron transport layer 109 is made, for example, of an organic material doped with at least one metal selected from a group consisting of alkali metals and alkaline-earth metals. Due to this, CT complexes are formed in the electron transport layer 109, and thus the electron transport layer 109 serves as an electron transport layer.

The organic material of the electron transport layer 109 may be a nitro-substituted fluorenone derivative, a thiopyran dioxide derivative, a diphenylquinone derivative, a perylene tetracarboxyl derivative, an anthraquinodimethane derivative, a fluorenylidene methane derivative, an anthrone derivative, an oxadiazole derivative, a perinone derivative, or a quinolone complex derivative. Further, it is preferable that the same metal as that composing the common electrode 110, which is described in detail later in the present disclosure, be contained in the organic material of the electron transport layer 109 as a dopant. For example, when the common electrode 110 is made of barium, it is preferable that barium be contained in the organic material of the electron transport layer 109 as a dopant.

The electron transport layer 109 may be made of a material other than an organic material doped with at least one metal selected from the group consisting of alkali metals and alkaline-earth metals. However, in order to serve as a charge transport layer, it is preferable that the electron transport layer 109 be made of a material having excellent electron-transporting characteristics. In addition, in order to prevent oxidization of the common electrode 100 by the electron transport layer 109, it is also preferable that the electron transport layer 109 is not made of an oxide.

The common electrode 110 is a cathode disposed on the electron transport layer 109, and is a continuous film that continuously extends over the auxiliary wiring 104 and the light-emission layer 108. The common electrode 110 is electrically connected with the auxiliary wiring 104. The common electrode 110 is made of at least one metal selected from the group consisting of alkali metals and alkaline-earth metals. Forming the common electrode 110 from such material lowers the electrode injection barrier between the common electrode 110 and the light-emission layer 108. As a result, even when the electron transport layer 109, which is a bottleneck in the movement of electrons, exists between the common electrode 110 and the light-emission layer 108, the influence of the electron transport layer 109 is reduced, and thus the rate at which electrons are injected into the light-emission layer 108 is not decreased.

As the material of the common electrode 110, barium is particularly preferable. Forming the common electrode 110 from barium results in a low electron injection barrier between the common electrode 110 and the light-emission layer 108, and thus electrons can be injected into the light-emission layer 108 at a low voltage. In addition, among various alkali metals and alkaline-earth metals, barium is a metal having relatively high stability on an industrial scale. Due to this, barium metal can be used by itself, without any additional processing such as fluoridation, as vapor deposition material for forming the common electrode 110. As such, barium can be handled with ease in the manufacturing process of the EL display device 1. Note that the common electrode 110 may contain a compound other than the at least one metal described above, provided that the amount of such compound does not exceed a level commonly considered as an impurity, or that is, as long as the electron injection barrier between the light-emission layer 108 and the common electrode 110 is retained at a low level.

The oxidation prevention layer 111 is a continuous film disposed on the common electrode 110, and is made of a material that does not contain any oxides. The oxidation prevention layer 111 prevents oxidation of the common electrode 110. The material of the oxidation prevention layer 111, which does not contain any oxides, is an organic material, for example. Further, it is preferable that the oxidation prevention layer 111 is made of the same organic material as the electron transport layer 109. When using the same organic material for the electron transport layer 109 and the oxidation prevention layer 111, the forming of the oxidation prevention layer 111 can be performed successively in the same chamber following the forming of the electron transport layer 109 and the common electrode 110. Further, it is preferable that the thickness of the oxidation prevention layer 111 be set taking into account the following: the oxidation prevention layer 111, when the thickness thereof is at least 50 nm, effectively prevents the oxidation of the common electrode 110; and the oxidation prevention layer 111, when the thickness thereof is at most 153 nm, does not intercept light emitted from the light-emission layer 108.

The sealing film 112 is a continuous film disposed on the oxidation prevention layer 111. The sealing film 112 prevents the common electrode 110, the light-emission layer 108, etc., from coming in contact with moisture, gasses, etc., during the manufacturing process of the EL display panel 10, particularly until the sealing layer 113 is formed. The sealing film 112 may be made, for example, of an oxide of the metal used for forming the common electrode 110. When using an oxide of the metal used for forming the common electrode 110 as the material of the sealing film 112, the forming of the sealing film 112 can be performed successively in the same chamber following the forming of the common electrode 110 and the oxidation prevention layer 111. Specifically, the forming of the sealing film 112 can be performed by forming a metal layer made of the same metal as that of the common electrode 110 and oxidizing the metal layer so formed. The metal layer may be oxidized when the EL display device 10, the manufacturing of which has been completed up to this point, is transferred to the site of the next process. Further, it is preferable that the thickness of the sealing film 112 be set taking into account the following: the sealing film 112, when the thickness thereof is at least 5 nm, achieves a desirable level of sealing; and the sealing film 112, when the thickness thereof is at most 10 nm, does not intercept light emitted from the light-emission layer 108.

The sealing layer 113 is disposed on the sealing film 112, and prevents the light-emitting layer 108, etc., from falling into contact with moisture, gasses, etc. In the EL display panel 10, which is a top-emission type display panel, it is preferable that the sealing layer 113 be made of a light-transmissive material. Examples of the light-transmissive material include silicon nitride (SiN) and silicon oxynitride (SiON).

The resin layer 114 is made of a dense resin material (e.g. silicone resin or acrylic resin), and is disposed between the sealing layer 113 and the glass plate 115. The resin layer 114 prevents the light-emitting layer 108, etc., from coming in contact with moisture and gasses.

Method of Manufacturing EL Display Device

Figure 3:
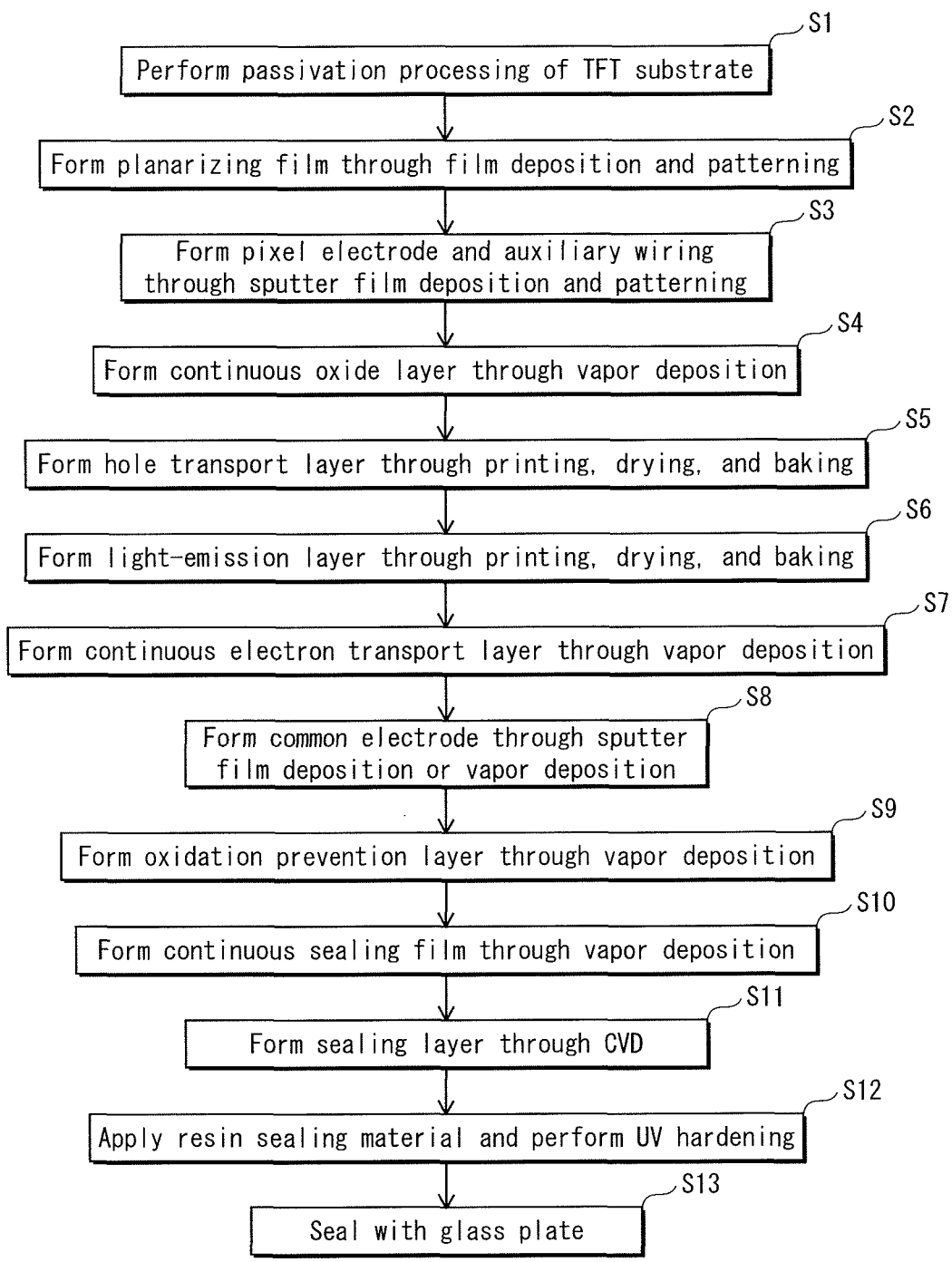
FIG. 3 is a process chart for explaining a process pertaining to the present disclosure of manufacturing an EL display device.

A method pertaining to the present disclosure of manufacturing an EL display device is characterized by a process of forming a display panel. Thus, description is provided in the following focusing on the process of forming a display panel. FIG. 3 is a process chart for explaining a process pertaining to the present embodiment of forming a display panel.

First in the process of forming a display panel, for example, the TFT substrate 101 is prepared and passivation processing is performed with respect to a surface of the TFT substrate 101, as illustrated in FIG. 3 (Step S1).

Subsequently, for example, a resin film is formed on the TFT substrate 101 by spin coating, and the resin film so formed is patterned by photoresist/photoetching (PR/PE), whereby the planarizing film 102 is formed (Step S2).

Subsequently, for example, (i) a matrix of metal layers is formed by first forming an ACL layer on the planarizing film 102 by sputtering and then patterning the ACL layer so formed by PR/PE, and (ii) metal oxide layers are formed by first forming an IZO layer by vacuum vapor deposition and then patterning the IZO layer so formed by PR/PE, whereby the pixel electrode 103 and the auxiliary wiring 104 are formed (Step S3). The pixel electrode 103 and the auxiliary wiring 104 are each formed in plurality, and each pixel electrode 103 and each auxiliary wiring 104 have a two-layer structure, being composed of a metal layer and a metal oxide layer formed as described above.

Subsequently, for example, a continuous film that continuously extends over the pixel electrode 103 and the auxiliary wiring 104 is formed by sputtering, whereby the oxide layer 105 is formed (Step S4).

Subsequently, for example, the banks 106 are formed to exhibit a lattice shape in plan view, and then the hole transport layer 107 is formed (Step S5). The hole transport layer 107 is formed in plurality, by first injecting ink containing the material of the hole transport layer 107 into each region defined by the banks 106 (i.e., each pixel region) using the inkjet method, then drying the film so formed by performing printing (i.e., the inkjet method), and finally performing baking processing.

Subsequently, for example, the light-emission layer 108 is formed (Step S6). The light-emission layer 108 is formed in plurality, by first injecting ink containing the material of the light-emission layer 108 onto the hole transport layer 107 within each region defined by the banks 106 (i.e., each pixel region) according to the inkjet method, then drying the film so formed by performing printing (i.e., the inkjet method), and finally performing baking processing. Note that the injection of ink into the pixel region may be performed according to methods other than the inkjet method. Such methods include the dispenser method, the nozzle coating method, the spin coating method, the intaglio printing method, and the relief printing method.

Subsequently, for example, a continuous film that is made of an organic material doped with 10 wt % barium is formed by employing vacuum vapor deposition, whereby the electron transport layer 109 is formed (Step S7). Here, the electron transport layer 109 is disposed on the oxide layer 105 above the auxiliary wiring 104 and on the light-emission layer 108 above the pixel electrode 103.

Subsequently, for example, a continuous film made of barium metal is formed on the electron transport layer 109 by employing vacuum vapor deposition, whereby the common electrode 110 is formed (Step S8).

Subsequently, for example, a continuous film made of the same organic material as the electron transport layer 109 is formed on the common electrode 110 by employing vacuum vapor deposition, whereby the oxidation prevention layer 111 is formed (Step S9).

Subsequently, for example, a continuous film made of barium metal is formed on the oxidation prevention layer 111 by employing vacuum vapor deposition, and the barium metal film so formed is caused to undergo natural oxidation, whereby the sealing film 112, which is made of barium oxide, is formed (Step S10).

Subsequently, the sealing layer 113 is formed on the common electrode 110 by employing CVD (Step S11).

Subsequently, application of a resin sealing material and UV irradiation for curing the resin sealing material is performed (Step 12). Then, a glass plate is placed on the cured resin sealing material to provide sealing (Step S13).

This concludes the process of forming a top-emission type display panel.

EXPERIMENTS

Experiment 1

Influence of Electron Injection Structure on Electron Injection

In an EL display device, when an electron transport layer is disposed between an organic light-emission layer and a common electrode provided for made of a material such as ITO or Al, in which an electron occupies a deep energy level, the electron transport layer, which is provided to inject electrons from the common electrode into the organic light-emission layer, becomes a bottleneck in the movement of electrons. This results in a small amount of electrons being injected into the organic light-emission layer, and further results in the lifetime of the EL display device being shortened. When the amount of electrons injected into the organic light-emission layer is small, a shortage of electrons occurs in the organic light-emission layer. This shortage of electrons results in an undesirable carrier balance in the organic light-emission layer. An undesirable carrier balance in the organic light-emission layer causes an internal electric field to be generated in the organic light-emission layer, which cancels the electric field generated outside the organic light-emission layer. Accordingly, higher voltage is necessary for driving the EL display device. When high voltage is applied to the EL display device, the temperature of the organic light-emission layer rises due to Joule heat being generated, which results in accelerated degradation of the material of the organic light-emission layer and shortening of the lifetime of the EL display device.

In addition, the shortage of electrons as described above gives rise to unevenness in charge at specific areas in the organic light-emission layer, which results in polarization and the consequent generation of intense electric fields at the specific areas. As a result, at the specific areas, a pair of a hole and an electron bound to one another, i.e., excitons, dissociate into a hole and an electron once again without contributing to light emission. Accordingly, the internal quantum efficiency of the EL display device decreases, i.e., the light-emission efficiency of the EL display device decreases. To compensate for this, the amperage of electric current applied to the EL display device needs to be increased. The temperature of the organic light-emission layer also rises when electric current with high amperage is applied to the EL display device, which again results in accelerated degradation of the material of the organic light-emission layer and shortening of the lifetime of the EL display device.

The amount of electrons injected into the organic light-emission layer can be assessed by examining the current density in the EL display device. As such, various EL display devices having structures based on that of the EL display device 1 pertaining to the present embodiment were prepared, and an experiment was conducted to examine the current density in each of such EL display devices. The EL display devices so prepared had different electron injection structures, i.e., one or more layers, including the common electrode, that are disposed above the light-emission layer and that contribute in the injection of electrons into the light-emission layer. Other than having different electron injection structures, the EL display devices had the same structures. Further, the EL display devices so prepared each had a light-emission layer emitting light of the color green. Finally, in ones of the EL display devices including electron transport layers, the electron transport layer was made of organic material doped with 5 wt % barium.

Figure 4:
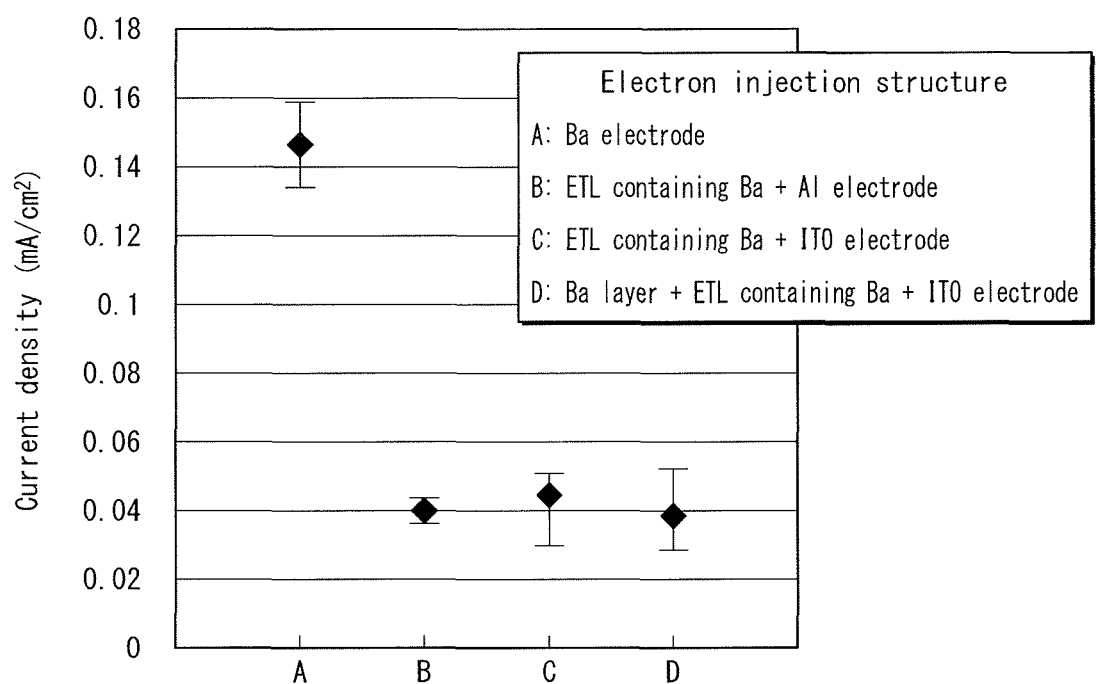
FIG. 4 illustrates the relation between electron injection structures and current density.

FIG. 4 illustrates the relation between electron injection structures and current density. As illustrated in FIG. 4, electron injection structure A, which was composed of a common electrode made of barium, achieved high current density. It is assumed that electron injection structure A, including a common electrode made of barium, results in a low electron injection barrier between the light-emission layer and the common electrode, and thus increases the amount of electrons injected into the light-emission layer.

Figure 5A:
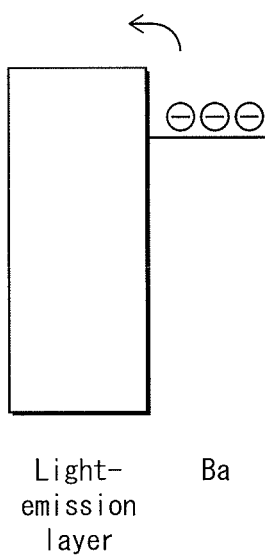
FIGS. 5A and 5B schematically illustrate band structures of a common electrode and a light-emission layer.
Figure 5B:
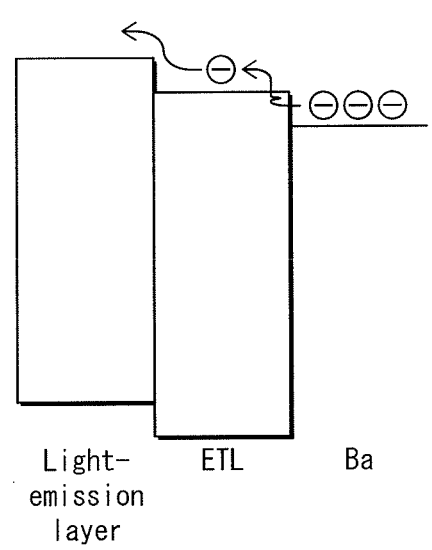

FIGS. 5A and 5B schematically illustrate band structures of a common electrode and a light-emission layer. FIG. 5A illustrates a case where the common electrode is made of barium and the electron transport layer does not exist between the light-emission layer and the common electrode. In this case, the electron injection barrier between the common electrode and the light-emission layer is low and electrons are injected into the light-emission layer even through the electron transport layer does not exist between the light-emission layer and the common electrode. In addition, in this case, because the electron transport layer, which becomes a bottleneck in the movement of electrons, does not exist between the light-emission layer and the common electrode, a large amount of electrons is injected into the light-emission layer. In this case, however, since the electron transport layer does not exist between the common electrode and the light-emission layer, the oxide layer and the common electrode come in contact with one another above the auxiliary wiring. This may result in the oxidation of the common electrode, which may further result in electrical disconnection between the auxiliary wiring and the common electrode (blocking of a tunnel current flowing between the auxiliary wiring and the common electrode).

FIG. 5B illustrates a case where the common electrode is made of barium and the electron transport layer (illustrated as ETL in FIG. 5B) exists between the light-emission layer and the common electrode. It is assumed that, similar to the case of electron injection structure A composed of a common electrode made of barium, high current density is achieved and a large amount of electrons are injected into the light-emission layer in the case illustrated in FIG. 5B, for example, as long as the common electrode is made of barium. As can be seen from FIG. 4, when the common electrode was made of a material such as ITO or Al, in which an electron occupies a deep energy level, and the electron transport layer was disposed between the light-emission layer and the common electrode, only a small amount of electrons was supplied to the light-emission layer. This applied regardless of the difference in electron injection structures. For example, only a small amount of electrons was supplied to the light-emission layer even when barium was disposed directly on the light-emission layer, to form a structure similar to electron injection structure A. It is assumed that only a small amount of electrons is supplied to the light-emission layer in such cases because a difference of at least 2 eV exists between barium and ITO/Al, and although this difference is overcome by electrons being injected into the light-emission layer via the CT complexes in the electron transport layer, the amount of electrons injected into the light-emission layer decreases when injected via the CT complexes. Based on this assumption, it is further assumed that even if the electron injection barrier exists between the common electrode and the light-emission layer, a large amount of electrons can be injected into the light-emission layer by using, for the common electrode, a material resulting in a low electron injection barrier between the common electrode and the light-emission layer, because electrons would be injected into the light-emission layer without passing through the CT complexes.

The above-described phenomenon, where electrons are injected from the common electrode into the light-emission layer without passing through the CT complexes even though the electron transport layer exists between the common electrode and the light-emission layer, occurs when the common electrode is made of at least one metal selected from the group consisting of alkali metals and alkali earth metals, one example of which being barium. This is because the electron injection barrier between the common electrode and the light-emission layer is low when the common electrode is made of such a material.

Meanwhile, when the electron transport layer exists between the common electrode and the light-emission layer as illustrated in FIG. 5B, the common electrode does not come in contact with the oxide layer due to the electron transport layer existing above the auxiliary wiring. As such, disposing the electron transport layer prevents the common electrode from oxidizing and blocking the tunnel current flowing between the auxiliary wiring and the common electrode.

Returning to FIG. 4, electron injection structure B was composed of an electron transport layer and a common electrode made of Al disposed on the electron transport layer. Current density was lower for electron injection structure B than for electron injection structure A. Electron injection structure C was composed of an electron transport layer and a common electrode made of ITO disposed on the electron transport layer. Similar to electron injection structure B, current density was lower for electron injection structure C than for electron injection structure A. Electron injection structures B and C are conventional structures, and it can seen that such conventional structures result in electrons being injected into the light-emission layer at a low rate.

Electron injection structure D was composed of a layer made of barium, an electron transport layer disposed on the layer made of barium, and a common electrode made of ITO disposed on the electron transport layer. Current density for electron injection structure D was low, similar to electron injection structures B and C. From this, it can be seen that when the electron injection barrier between the common electrode and the light-emission layer is high, the rate at which electrons are injected into the light-emission layer does not increase even when a layer composed of barium is disposed between the common electrode and the light-emission layer.

Experiment 2

Carrier Balance Achieving Favorable Lifetime Characteristics

As already described above, when electrons are injected into the light-emission layer at a low rate, a shortage of electrons occurs, which results in an undesirable carrier balance in the light-emission layer. Accordingly, the lifetime of the EL display device is shortened. However, when seen in another way, this means that the lifetime of the EL display device can be improved by realizing desirable carrier balance in the light-emission layer. As such, an experiment was conducted to determine a current density range yielding a desirable carrier balance in the light-emission layer.

In the experiment, various EL display devices having structures based on that of the EL display device 1 pertaining to the present embodiment were prepared, and a current density range yielding desirable lifetime-related characteristics was investigated. The EL display devices so prepared each had a light-emission layer emitting light of the color green. Further, the EL display devices so prepared each had an electron transport layer made of organic material doped with 10 wt % barium.

Figure 6:
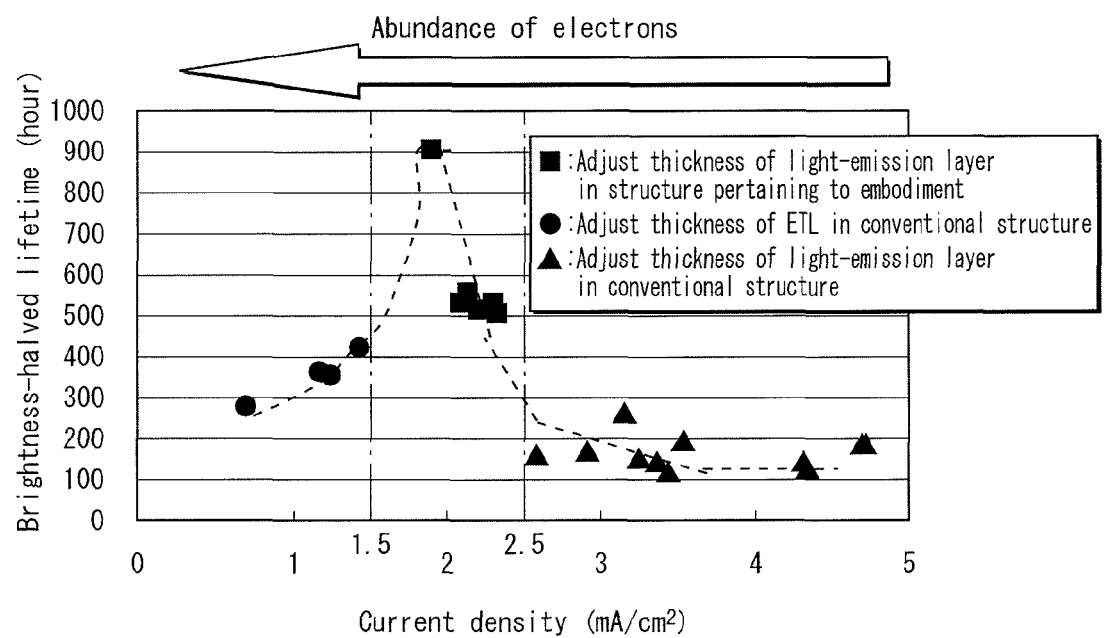
FIG. 6 illustrates a relation between current density and lifetime-related characteristics.

FIG. 6 illustrates a relation between current density and lifetime-related characteristics. In FIG. 6, current density values on the X axis are values determined based on the correlation between current density and light-emission efficiency. Specifically, each current density value indicates a current density per unit area of an EL display device at an initial stage when current achieving maximum light-emission efficiency is applied to the EL display device. Further, each brightness-halved lifetime value on the Y axis is a relative value indicating the time until brightness of an EL display device decreased to half the initial level. In the experiment, each EL display device was driven for a predetermined period of time by applying a constant load current thereto, and measurement was performed of the current density and the brightness of the EL display device.

As illustrated in FIG. 6, current densities of EL display devices each having exactly the same structure as the EL display device 1 pertaining to the present embodiment were within a range of at least 1.5 mA/cm$^2$ and at most 2.5 mA/cm$^2$. Further, such EL display devices had favorable lifetime-related characteristics due to a desirable carrier balance in the light-emission layer. Further, an EL display device corresponding to a current density of 2 mA/cm$^2$ had the longest lifetime. Here, note that adjustment of the carrier balance in the light-emission layer was performed by providing the EL display devices with light-emission layers of different thickness. Adjustment was performed in such a manner because the thickness of a light-emission layer greatly affects the carrier balance in the light-emission layer due to the quantity of hole current and electron current flowing in a light-emission layer being regulated by space charge limited current and being inversely proportional to the cube of the thickness of the light-emission layer. Here, as described above, EL display devices including light-emission layers that emit green light were used in the experiment. In this case, it was possible to set the carrier balance in the light-emission layers to a desirable state by providing the light-emission layers with a thickness within a range of at least 60 nm and at most 100 nm. Further, when providing light-emission layers with a thickness within this range, the EL display devices including the light-emission layers had current density values within a range of at least 1.5 mA/cm$^2$ and at most 2.5 mA/cm$^2$. Further, when provided with a light-emission layer with a thickness of 90 nm, an EL display device had a current density value of 2 mA/cm$^2$, which achieved the longest lifetime.

Meanwhile, with regards to EL display devices including conventional structures where the common electrode is made of a material such as Al or ITO, none of the El display devices could be controlled to have a current density within the range of at least 1.5 mA/cm$^2$ and at most 2.5 mA/cm$^2$, which indicates a desirable carrier balance in a light-emission layer, however the thickness of the electron transport layer and the light-emission layer was adjusted. Thus, EL display devices having favorable lifetime-related characteristics were difficult to achieve when the EL display devices included the conventional structures.

As described above, EL display devices having exactly the same structure as the EL display device 1 could be controlled to have a current density within the range of 1.5 mA/cm$^2$ and at most 2.5 mA/cm$^2$. This is due to electrons being injected into the light-emission layer at a high rate, which is a result of the common electrode in such EL display devices being made of barium. When electrons are injected into the light-emission layer at a high rate, an abundant amount of electrons exists in the light-emission layer when seen in relation to the amount of holes in the light-emission layer at the initial stage of operation of an EL display device. This enables designing EL display devices to have a structure such that a desirable carrier balance in the light-emission layer is ensured even when a decrease in electrons occurs later in the operation of the EL display devices. Thus, a desirable carrier balance in the light-emission layer can be achieved.

Experiment 3

Ensuring Conduction between Auxiliary Wiring and Common Electrode with Electron Transport Layer Next, in order to confirm that the electron transport layer ensures electrical conduction between the auxiliary wiring and the common electrode, devices not including the hole transport layer, the light-emission layer, and the banks were prepared. Further, the electrical conductivity between the auxiliary wiring and the common electrode in each of such devices were examined. Specifically, each of the devices prepared included the TFT substrate, and other layers such as the planarizing film, the pixel electrode, the auxiliary wiring, the oxide layer, the electron transport layer, and the common electrode disposed in the stated order above the TFT substrate. In each of the devices, the common electrode was made of barium. Each of the devices so prepared had different auxiliary wiring connection structures, i.e., one or more layers, including the common electrode, disposed above the auxiliary wiring. Other than having different auxiliary wiring connection structures, the devices had the same structure.

Figure 7:
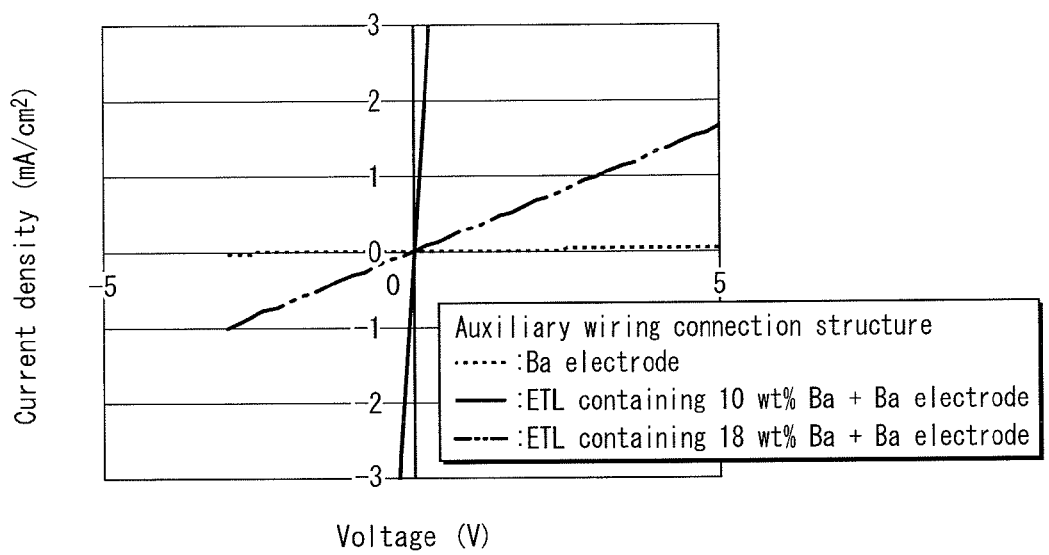
FIG. 7 illustrates an influence that the concentration of barium in an electron transport layer has on electric insulation between auxiliary wiring and the common electrode.

FIG. 7 illustrates an influence that the concentration of barium in the electron transport layer has on the electric insulation between the auxiliary wiring and the common electrode. The broken line in FIG. 7 indicates a device where an electron transport layer was not disposed between the light-emission layer and the common electrode made of barium. Hardly any current flowed through this device even when voltage was applied thereto. This is considered as being a result of the following: the oxide layer and the common electrode come in contact with each other above the auxiliary wiring due to the electron transport layer not being disposed; a portion of the common electrode coming in contact with the oxide layer oxidizes and becomes a film of barium oxide, which has electrically-insulating characteristics; and the film of barium oxide blocks the electrical conduction between the auxiliary wiring and the common electrode.

The solid line in FIG. 7 indicates a device where an electron transport layer containing 10 wt % barium was disposed between the light-emission layer and the common electrode made of barium. The electrical conductivity between the auxiliary wiring and the common electrode in this device was high. This is considered as being a result of the following: the electron transport layer prevented the common electrode from oxidizing; and due to this, the electrical conduction between the auxiliary wiring and the common electrode was not blocked.

The long dashed double short dashed line in FIG. 7 indicates a device where an electron transport layer containing 18 wt % barium was disposed between the light-emission layer and the common electrode made of barium. The electrical conductivity between the auxiliary wiring and the common electrode in this device was lower compared to the above-described device where the electron transport layer contained 10 wt % barium. The reason for this is considered to be the existence of free barium atoms in the electron transport layer.

Figure 8:
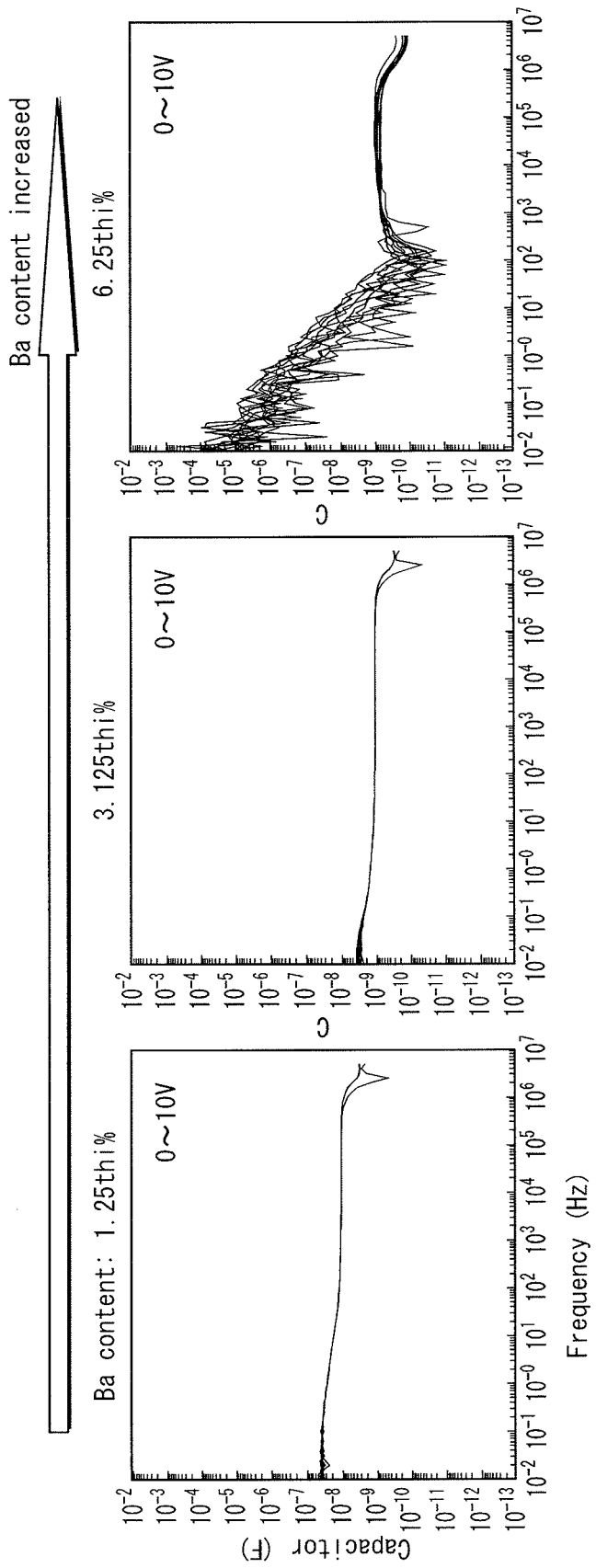
FIG. 8 illustrates the relation between the concentration of barium and impedance.

FIG. 8 illustrates the relation between the concentration of barium and impedance. As illustrated in FIG. 8, as the concentration of barium in the electron transport layer increases, impedance becomes less stable. From this, it was confirmed that, when the concentration of barium is low, barium exists in a stable state in the electron transport layer to form CT complexes, but when the concentration of barium increases, free barium atoms are generated in the electron transport layer. The generation of free barium atoms is considered to be problematic since it can be assumed that some of the free barium atoms so generated move to a surface portion of the electron transport layer that is at the interface between the electron transport layer and the oxide layer. At the surface portion, the free barium atoms are oxidized by the oxide layer, and a film of barium oxide is formed, which impairs the electrical conductivity of the electron transport layer. In specific, it is considered that free barium atoms were generated in the electron transport layer containing 18 wt % barium. As such, it was observed that the concentration of barium in the electron transport layer should be within a specific, desirable range. In other words, it was observed that a high concentration of barium in the electron transport layer not necessarily achieves desirable results.

Figure 9:
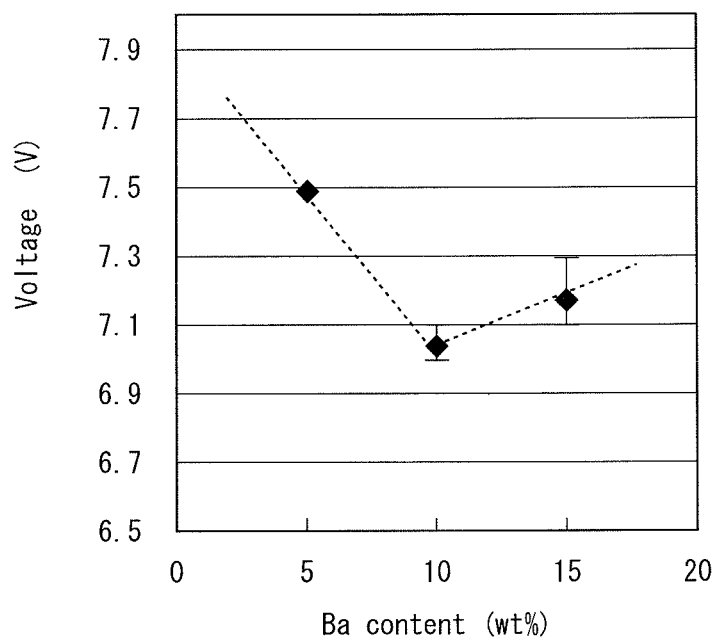
FIG. 9 illustrates the relation between the concentration of barium and voltage.

Based on this, further observation was conducted regarding the concentration of barium in the electron transport layer. FIG. 9 illustrates the relation between the concentration of barium and voltage. Voltage was lowest when the electron transport layer contained 10 wt % barium. Based on this, it is assumed that the electric conductivity between the auxiliary wiring and the common electrode is most desirable when the electron transport layer contains 10 wt % barium. Similarly, voltage was within a desirable level when the electron transport layer contained at least 5 wt % barium and at most 15 wt % barium. Based on this, it is assumed that the electric conductivity between the auxiliary wiring and the common electrode is desirable when the electron transport layer contains at least 5 wt % barium and at most 15 wt % barium.

Modification

Specific description has been made so far on an EL display device pertaining to the present disclosure and a method pertaining to the present disclosure for manufacturing an EL display device, based on one embodiment thereof. It should be noted that the above-mentioned embodiment is merely one example used to give a clear explanation of the configuration and the effects of the present disclosure, and thus the present disclosure encompasses other forms of embodiment.

The configuration pertaining to the present disclosure may be applied to an EL display device having pixels of the colors R, G, and B. In such a case, the configuration may be applied to pixels of all of the three colors, or may be applied only to pixels of one of the three colors. As a matter of course, the configuration may be applied to pixels of two of the three colors. Note that the configuration pertaining to the present disclosure is particularly effective when applied to pixels of the color G because electrons are injected into the light-emission layer at a relatively low rate in pixels of the color G, which shortens the lifetime of EL display devices.

In the embodiment, the pixel electrode functions as an anode and the common electrode functions as a cathode, and the electron transport layer serves as the charge transport layer pertaining to the present disclosure. Alternatively, when the pixel electrode functions as a cathode and the common electrode functions as an anode, the hole transport layer may serve as the charge transport layer pertaining to the present disclosure.

Figure 10:
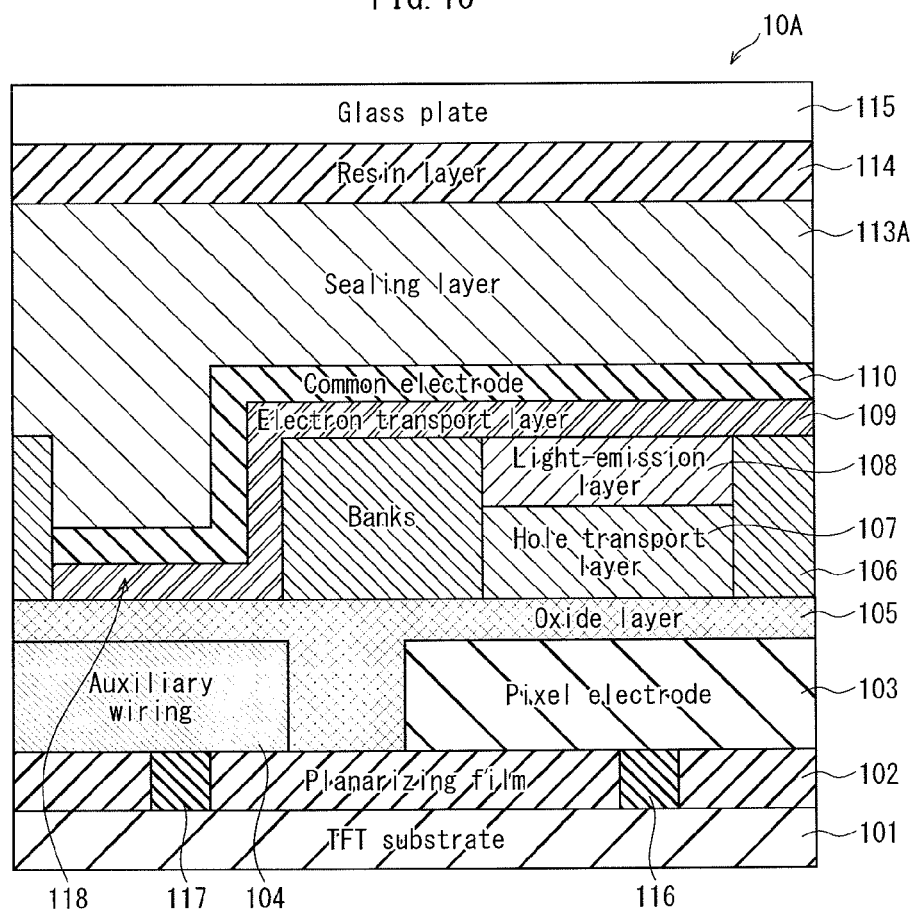
FIG. 10 is a schematic cross-sectional diagram illustrating a display panel pertaining to a modification.
Figure 11A:
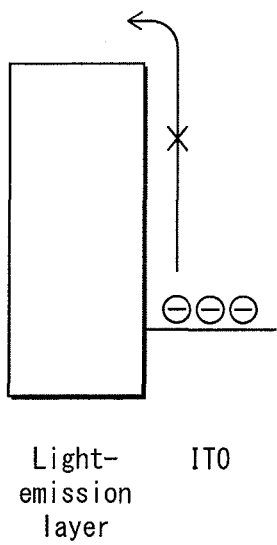
FIGS. 11A and 11B schematically illustrate band structures of a common electrode and a light-emission layer that conventional technology provides.
Figure 11B:
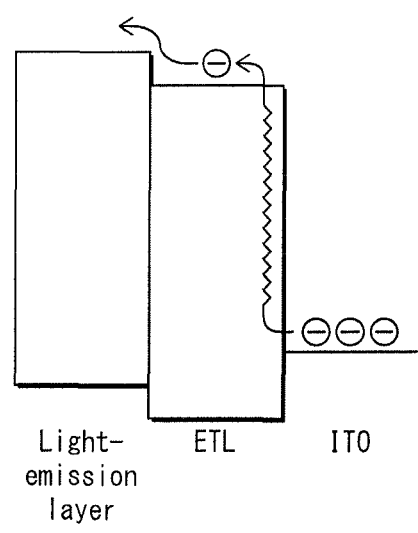

In the embodiment, the oxidation prevention layer and the sealing film are disposed above the pixel electrode. However, the oxidation prevention layer and the sealing film need not be included in the EL display device pertaining to the present disclosure. FIG. 10 is a schematic cross-sectional diagram illustrating a display panel pertaining to this modification. In a display panel 10A pertaining to this modification, illustration of which is provided in FIG. 10, neither an oxidation prevention layer nor a sealing film is disposed above the common electrode 110, and a sealing layer 113A is disposed directly on the common electrode 110. The display panel 10A with such a structure achieves the effects pertaining to the present disclosure. Note that in FIG. 10, elements of the display panel 10A that are provided with the same reference signs as the corresponding elements of the display panel 10 have the same structures as the corresponding elements of the display panel 10.

INDUSTRIAL APPLICABILITY

The EL display device pertaining to the present disclosure is widely usable in the field of EL display devices, which include passive matrix EL display devices and active matrix EL display devices, etc.

REFERENCE SIGNS LIST

1 EL display device
101 TFT substrate
103 pixel electrode (anode)
104 auxiliary wiring
108 light-emission layer
109 charge transport layer (electron transport layer)
110 common electrode (cathode)
105 oxide layer (hole transport layer)
111 oxidation prevention layer
112 sealing film

The invention claimed is:

1. An EL display device comprising:
a base;
a pixel electrode disposed on the base;
auxiliary wiring disposed on the base, the auxiliary wiring not overlapping with the pixel electrode;
a light-emission layer disposed above the pixel electrode;
a charge transport layer disposed above the auxiliary wiring and the pixel electrode, the charge transport layer continuously extending over the auxiliary wiring and the pixel electrode; and
a common electrode disposed on the charge transport layer, the common electrode electrically connected to the auxiliary wiring and continuously extending over the auxiliary wiring and the pixel electrode, wherein
the common electrode includes at least one metal selected from a group consisting of alkali metals and alkaline-earth metals.

2. The EL display device of claim 1 further comprising:
an oxide layer disposed above the pixel electrode and the auxiliary wiring, the oxide layer including an oxide of a transition metal and continuously extending over the auxiliary wiring and the pixel electrode, wherein
the charge transport layer is disposed on the oxide layer and includes an organic material doped with at least one metal selected from the group consisting of alkali metals and alkaline earth metals.

3. The EL display device of claim 1, wherein
the common electrode includes barium.

4. The EL display device of claim 3, wherein
the charge transport layer includes at least 5 wt % barium and at most 18 wt % barium.

5. The EL display device of claim 1, wherein
the light-emission layer has a thickness of at least 60 nm and less than 100 nm.

6. The EL display device of claim 1, wherein
current density per unit area of the light-emission layer is at least 1.5 mA/cm$^2$ and at most 2.5 mA/cm$^2$.

7. The EL display device of claim 1 further comprising:
an oxidation prevention layer disposed on the common electrode, the oxidation prevention layer including the same organic material as the charge transport layer.

8. The EL display device of claim 7 further comprising:
a sealing film disposed on the oxidation prevention layer, the sealing film including an oxide of said at least one metal.

9. The EL display device of claim 1, wherein
the pixel electrode is an anode,
the common electrode is a cathode, and
the charge transport layer is an electron transport layer.

10. The EL display device of claim 9 further comprising:
an oxide layer disposed above the pixel electrode and the auxiliary wiring, the oxide layer including an oxide of a transition metal and continuously extending over the auxiliary wiring and the pixel electrode, wherein
the oxide layer is a hole injection layer including one of tungsten oxide and molybdenum oxide.

11. A method of manufacturing an EL display device, the method comprising:
forming a pixel electrode on a base;
forming auxiliary wiring on the base, the auxiliary wiring not overlapping with the pixel electrode;
forming a light-emission layer above the pixel electrode;
forming a charge transport layer above the auxiliary wiring and the pixel electrode, the charge transport layer continuously extending over the auxiliary wiring and the pixel electrode; and
forming a common electrode on the charge transport layer, the common electrode including at least one metal selected from a group consisting of alkali metals and alkaline-earth metals, continuously extending over the auxiliary wiring and the pixel electrode, and being electrically connected to the auxiliary wiring.

* * * * *